(12) United States Patent
Ferchland et al.

(10) Patent No.: US 9,054,718 B2
(45) Date of Patent: Jun. 9, 2015

(54) OPERATING A TRANSCEIVER

(75) Inventors: Tilo Ferchland, Dresden (DE); Sascha Beyer, Medingen (DE); Dietmar Eggert, Dresden (DE); Udo Walter, Dresden (DE)

(73) Assignee: Atmel Corporation, San Jose, CA (US)

( * ) Notice: Subject to any disclaimer, the term of this patent is extended or adjusted under 35 U.S.C. 154(b) by 248 days.

(21) Appl. No.: 13/307,561

(22) Filed: Nov. 30, 2011

(65) Prior Publication Data

US 2012/0163424 A1 Jun. 28, 2012

Related U.S. Application Data

(60) Provisional application No. 61/426,673, filed on Dec. 23, 2010.

(30) Foreign Application Priority Data

Dec. 22, 2010 (DE) .......................... 10 2010 055 504

(51) Int. Cl.
*H03L 7/183* (2006.01)
*H04B 1/66* (2006.01)

(52) U.S. Cl.
CPC ................ *H03L 7/183* (2013.01); *H04B 1/662* (2013.01)

(58) Field of Classification Search
USPC ........................................................ 375/219
See application file for complete search history.

(56) References Cited

U.S. PATENT DOCUMENTS

| 7,039,380 | B2 | 5/2006 | Jahene | |
|---|---|---|---|---|
| 7,315,590 | B1 * | 1/2008 | Okuyama et al. | ............. 375/344 |
| 7,636,547 | B2 * | 12/2009 | Minotani et al. | ............. 455/41.1 |
| 7,822,397 | B2 * | 10/2010 | Horvath et al. | ............. 455/161.3 |
| 8,284,032 | B2 * | 10/2012 | Lee et al. | ................... 340/10.32 |
| 2004/0000956 | A1 | 1/2004 | Jaehne | |
| 2006/0146914 | A1 * | 7/2006 | Horvath et al. | ............... 375/137 |

(Continued)

FOREIGN PATENT DOCUMENTS

| DE | 102 29 130 B3 | 2/2004 |
|---|---|---|
| DE | 102 51 315 A1 | 5/2004 |

(Continued)

OTHER PUBLICATIONS

"Part 15.4: Wireless Medium Access Control (MAC) and Physical Layer (PHY) Specifications for Low-Rate Wireless Personal Area Networks (WPANs)," *IEEE Std* 802.15.4™-2006, Sep. 8, 2006.

(Continued)

*Primary Examiner* — Santiago Garcia
(74) *Attorney, Agent, or Firm* — Fish & Richardson P.C.

(57) ABSTRACT

In one embodiment, a transceiver may set a first receive frequency of a first channel of the transceiver and a second receive frequency of a second channel of the transceiver. The transceiver may receive, during a first time interval, a first radio frequency (RF) signal on the first channel. The transceiver may determine that a first measured value indicative of a first detectable received RF signal on the first channel exceeds a first predetermined threshold, and in response, receive a first data frame on the first channel. The transceiver may receive, during a second time interval, a second RF signal on the second channel. The transceiver determine that a second measured value indicative of a second detectable received RF signal on the second channel exceeds the first predetermined threshold, and in response, receive a second data frame on the second channel.

17 Claims, 7 Drawing Sheets

(56) References Cited

U.S. PATENT DOCUMENTS

| | | |
|---|---|---|
| 2008/0288570 A1 | 11/2008 | Ferchland |
| 2009/0092206 A1* | 4/2009 | Kajihara ........................ 375/343 |
| 2010/0019947 A1* | 1/2010 | Kruys et al. .................... 342/20 |
| 2010/0210278 A1* | 8/2010 | Huang ........................ 455/452.1 |
| 2011/0039512 A1 | 2/2011 | Ferchland |
| 2012/0263061 A1* | 10/2012 | Reial et al. .................... 370/252 |

FOREIGN PATENT DOCUMENTS

| | | |
|---|---|---|
| DE | 10 2009 057 442 A1 | 8/2010 |
| EP | 2 047 608 B1 | 10/2009 |

OTHER PUBLICATIONS

Office Action and English translation for German Patent Application 10 2010 055 0504.5, Sep. 22, 2011.

* cited by examiner

OPERATING A TRANSCEIVER

RELATED APPLICATIONS

This application claims the benefit, under 35 U.S.C. §119 (e), of U.S. Provisional Patent Application No. 61/426,673, entitled "Transceiver and Method for Operating a Transceiver," filed 23 Dec. 2010. This application also claims the benefit, under 35 U.S.C. §119(a), of German Patent Application No. 102010055504.5-35, entitled "Send-Empfangs-Vorrichtung and Verfahren zum Betrieb einer Sende-Empfangsvorrichtung," filed 22 Dec. 2010.

TECHNICAL FIELD

This disclosure relates to a transceiver.

BACKGROUND

A transceiver is a device that has both a transmitter and a receiver that are combined and may share common circuitry or a single housing.

DESCRIPTION OF EXAMPLE EMBODIMENTS

This disclosure relates to a transceiver.

Figure 1:
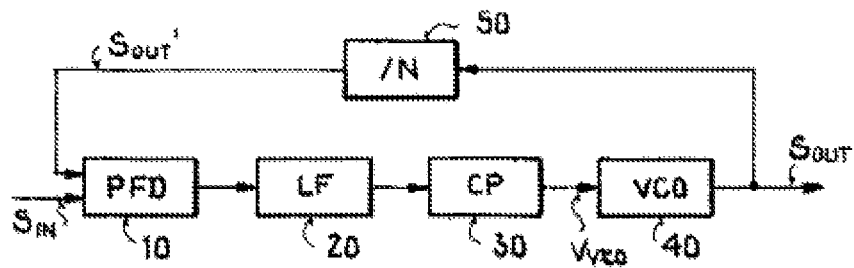
FIG. 1 shows an example phase-locked loop.

A phase locked loop (PLL) frequency synthesizer is known from U.S. Patent Application No. 2004/0000956, which claims priority to German Patent No. DE 102 29 130 B3. This synthesizer is a circuit generating an output signal having a particular frequency that has a constant phase relationship to an input signal. The general design of the PLL frequency synthesizer from U.S. Patent Application No. 2004/0000956 is shown in the block diagram of FIG. 1. The PLL frequency synthesizer comprises a phase/frequency detector (PFD) 10, a low-pass (LP) filter 30, and a voltage-controlled oscillator (VCO) 40. An input signal $S_{IN}$ is supplied to the PFD 10, and the output signal $S_{OUT}$ of the VCO 40 is fed back to the PFD 10 via the frequency divider 50. The PFD 10 compares the phase of the input signal $S_{IN}$ to the phase of the fed-back signal $S_{OUT}$. If the two signals differ from each other, the PFD 10 outputs an error signal indicating the magnitude of the difference. The error signal actuates the VCO 40 so that the frequencies of the input signals ($S_{IN}$, $S_{OUT}$) to the PFD 10 ultimately match. The output signal ($S_{OUT}$) of the VCO 40 is coupled to the phase of the input signal ($S_{IN}$) when the phase difference drops below a particular error value. The output frequency of the output signal $S_{OUT}$ may be a multiple of the frequency of the input signal $S_{IN}$ when employing a feedback divider 50. Because of the effect of the feedback path in the PLL, the VCO output signal $S_{OUT}$ has a fixed phase relationship to the input signal $S_{IN}$. The phases of the input signal $S_{IN}$ and output signal $S_{OUT}$ are synchronized with minimal phase offset. In many cases, a charge pump (CP) 20 is used to produce the tuning voltage for the VCO 40 based on the error signal output by the PFD 10. A LP filter 30 connected between the charge pump 20 and the VCO 40 is used to eliminate high frequency components from the VCO tuning voltage $V_{VCO}$. For low-noise PLL applications, the loop gain of the VCO frequency control characteristic is one of the key parameters. To achieve low VCO phase noise, the PLL frequency synthesizer should have relatively low gain. In order to reduce the phase noise, VCOs are frequently designed to distribute the total operating frequency range among a plurality of operating frequency ranges. Such a VCO may reliably operate over a wide range of output frequencies using relatively small VCO gain and a relatively small range of input voltages. In U.S. Patent Publication No. 2004/0000956, the VCO 40 is operated in one of a plurality of frequency ranges, which are also referred to as operating modes, using a particular operating curve so as to generate an output frequency depending on the VCO input voltage $S_{IN}$. To achieve the desired PLL operation, that frequency range with the operating curve of the VCO 40 must be selected the center frequency of which is close to the desired PLL output frequency.

Figure 2:
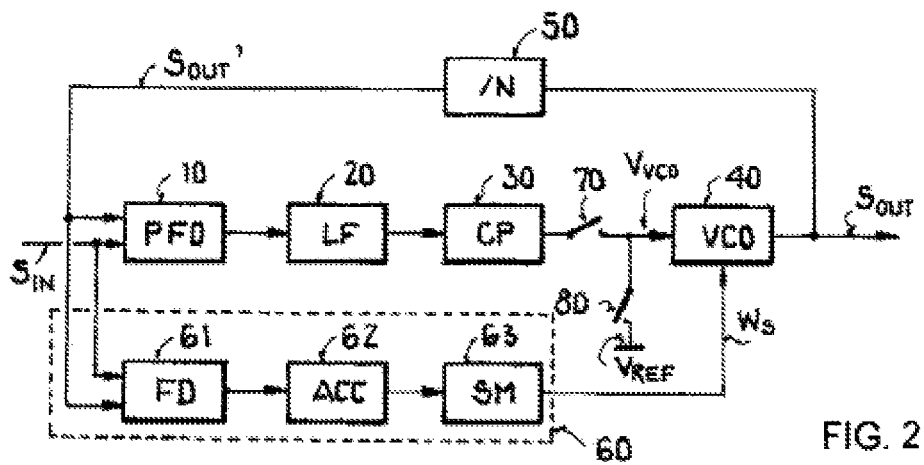
FIG. 2 shows an example phase-locked loop comprising a self-calibrating circuit.

A further PLL frequency synthesizer from U.S. Patent Publication No. 2004/0000956 is shown in FIG. 2. Each of the operating curves of the VCO 40 has low gain and is operated at the same range of input voltages $V_{VCO}$. Each of the operating curves of the VCO is selected by a particular digital control word $W_S$ supplied to the VCO 40.

In a procedure for automatically selecting an appropriate operating curve, a reference voltage $V_{REF}$ is supplied to the VCO input by means of a self-calibrating circuit 60 rather than the loop filter voltage. The reference voltage $V_{REF}$ is preferably the nominal center of the range of the input voltage $V_{VCO}$ in which the VCO 40 is supposed to be operated. As illustrated in FIG. 2, switches 70 and 80 may be opened and closed accordingly. The operating curve is selected by the control word $W_S$ supplied by the self-calibration circuit 60. The self-calibrating circuit 60 receives the PLL input signal $F_{IN}$ and the PLL feedback signal $F_{OUT}'$. The self-calibration circuit 60 comprises a frequency detector (FD) 61, a digital accumulator (ACC) 62, and a state machine (SM) 63.

During self-calibration, the digital control word supplied to the VCO 40 is determined by incrementally increasing the digital control word $W_S$ until the measurement result of frequency detector 61 indicates that a desired optimal operating state of the VCO is selected. The calibration circuit 60 may comprise a window comparator, which defines upper and lower error voltage limits for switching to adjacent frequency ranges.

From U.S. Pat. No. 7,039,380, which claims priority to German Patent No. DE 102 51 315, an estimation unit is known (not shown), which may estimate a new center frequency value at channel switching, wherein the new center frequency may be set to an estimated value that is based on a current value.

Figure 3:
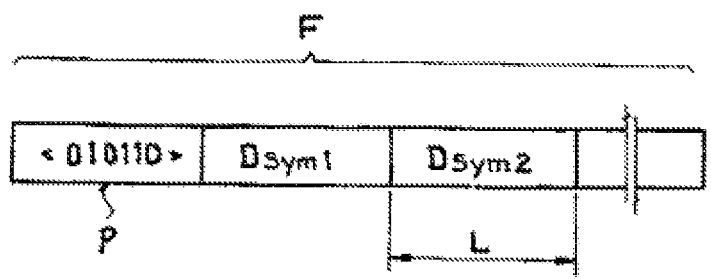
FIG. 3 shows an example schematic view of a frame according to the Institute of Electrical and Electronics Engineers (IEEE) 802.15.4-2006 industry standard.

As is shown in FIG. 3, symbols DSym1, DSym2 to be transmitted are transmitted in a frame F, wherein according to the IEEE 802.15.4-2006 industry standard the frame F has a sequence known on the receiver-side, for example a pseudo noise (PN) sequence, in the form of a preamble P. Based on the preamble P, first a frame detection step is carried out in the receiver, during which the symbol boundaries are determined. A received signal according to the IEEE 802.15.4 industry standard is shown in simplified form in FIG. 3. The frame F comprises the symbols DSym1 and DSym2, each having L sampled values (coefficients) and the preamble P, which contains, for example, the recurring coefficients 010110 previously known on the receiver side.

Figure 4:
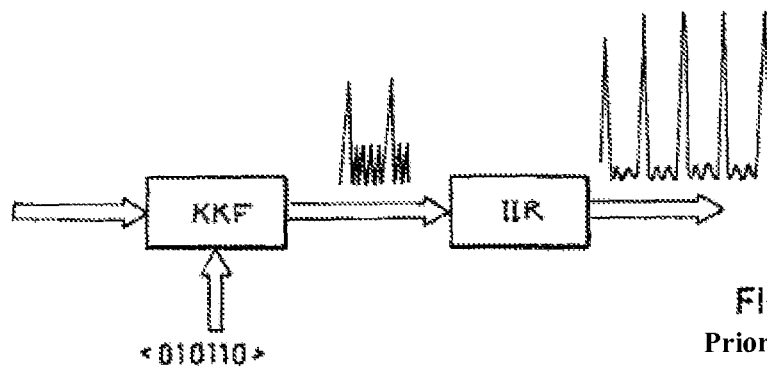
FIG. 4 shows an example schematic illustration of a correlation device according to the prior art.

From U.S. Patent Publication No. 2008/0288570, which claims priority to German Patent Application No. DE 102007022978.1, a cross-correlation for this is known. For receiver-side frame synchronization, the received signal is first supplied to the cross-correlation filter KKF shown in FIG. 4, which performs a cross-correlation between the received signal and the coefficient of the preamble P previously known on the receiver side. The output signal of the cross-correlation filter KKF has periodic peaks, which in each case indicate a correlation maximum. A correlation maximum arises during complete or almost complete overlapping of the preamble P contained in the received signal and the preamble used on the receiver-side for cross-correlation. In this way, a conclusion may be reached about the particular frame or symbol boundary based on the correlation maxima, which may be detected, for example, by means of a threshold value detector.

Figure 5:
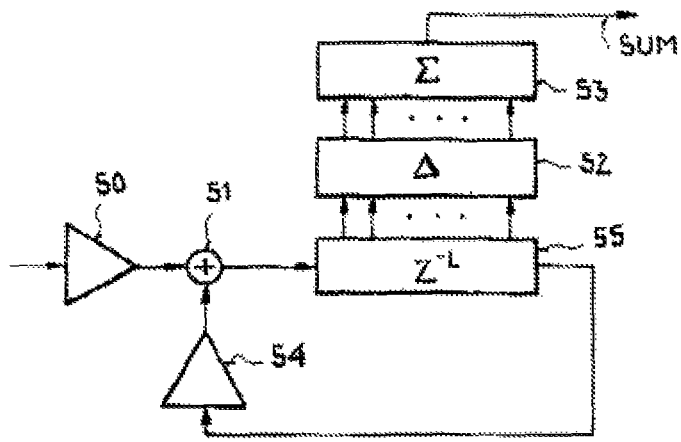
FIG. 5 shows an example schematic block diagram of a correlation device.

In order to express the correlation maxima more strongly, a comb filter Infinite Impulse Response (IIR), which is, for example, an IIR filter with a low-pass characteristic, may be connected downstream of the cross-correlation filter KKF. The correlation device shown in FIG. 5 is known from U.S. Patent Publication No. 2008/0288570. It comprises an adder 51, the output of which is connected to an input of a delay element 55. The delay element 55 comprises an output, which is coupled to an input of the adder 51 via an optional amplifier 54. The delay element 55 comprises further, for example L outputs, with L being a natural number, which are connected in each case to corresponding L inputs of a linking element 52 (Δ). The linking element 52 comprises L outputs, which are coupled to L inputs of an addition element 53 (Σ). Furthermore, an optional amplifier 50 is provided.

An input signal sequence is supplied to the adder 51 after optional amplification by the amplifier 50. The adder 51 outputs an addition signal sequence to the input of delay element 55, which delays the addition signal sequence by, for example L clocks (in relation to the underlying sampling rate of the addition signal sequence or to the clock rate with which the delay element 55 is clocked). For this purpose, the delay element 55 comprises, for example L memory cells of a shift register, wherein each memory cell is assigned an output. The L coefficients of the addition signal sequence, which represent the content of the memory cells, are supplied in parallel to the linking element 52, which links these in terms of coefficients, to linking coefficients, for example by means of scaling, addition, or multiplication. The linking coefficients correspond, for example, to the coefficients of the preamble P or are derived based on the coefficients of the preamble P, for example by the differential modulation or demodulation thereof. As a result of the linking L, the linking element 52 supplies correlation results, which are added by the addition unit 52, wherein the summation result SUM may be output via the output.

From U.S. Patent Publication No. 2011/0039512, which claims priority to German Patent Application No. DE 10 2009 057 442 A1, a method is known for operating a receiver of a wireless network according to the IEEE 802.15.4 industry standard, the receiver comprising circuit blocks disposed in a receive path. In the method, a receive mode is activated for determining a preamble. In the receive mode, at least some of the circuit blocks in the receive path of the receiver are alternately activated for an activation duration and deactivated for a deactivation duration. The deactivation duration is shorter than the preamble. A first measured value is measured in the receive path. The first measured value is compared to a first threshold. The activation duration or the deactivation duration are varied based on the result of the comparison to the first threshold. The deactivation is ended and the circuit blocks remain activated for synchronization by means of the preamble if, during the activation duration, a valid signal of the preamble is determined by comparing a second measured value to a second threshold.

Particular embodiments provide an improved transceiver that is suited for the IEEE 802.15.4 industry standard.

Particular embodiments provide a transceiver for wireless networks. The transceiver comprises a receiver unit for receiving frames and for detecting preambles of the frames. In particular embodiments, the receiver unit detects the preambles in a first channel and in a second channel during ongoing operation. It is not necessary to reconfigure the transceiver when switching between the first channel and the second channel.

The transceiver comprises a tunable oscillator device, which is connected to the receiver unit for setting a first receive frequency of the first channel and a second receive frequency of the second channel.

The transceiver comprises a programmable first configuration register for setting the first receive frequency. In particular embodiments, the configuration register may be programmed by means of a connected interface. An identifier, notably a binary identifier for a receive frequency and thus for the desired channel, may be stored in the first configuration register. The transceiver additionally comprises a programmable second configuration register for setting a second receive frequency. In particular embodiments, the transceiver comprises further configuration registers, such as a third configuration register, for example, for a third receive frequency and a fourth configuration register for a fourth receive frequency.

The transceiver comprises a control unit for controlling the tunable oscillator device. In particular embodiments, the control unit is connected to at least the first configuration register and the second configuration register. The control unit may have a digital logic, for example in the form of a state machine, for control purposes.

The control unit is equipped to control the oscillator device in a first predefined time interval with the first received frequency of the first channel by reading the first configuration register. Accordingly, the control unit reads the first configuration register and sets an output frequency of the oscillator device to the first receive frequency of the first channel. The detection of a preamble that may be contained in the received signal in the first channel is limited by the first time interval. The detection in the first channel is aborted when the first time interval ends.

The control unit is also equipped to control the oscillator device in a second predefined time interval with the second receive frequency of the second channel by reading the second configuration register. Accordingly, control unit reads the second configuration register and sets an output frequency of the oscillator device to the second receive frequency of the second channel. The detection of a preamble that may be contained in the received signal in the second channel is limited by the second time interval. The detection in the second channel is aborted when the second time interval ends.

In particular embodiments, during a process of a frame search by the detection of the preamble, switching takes place alternately between the first receive frequency and the second receive frequency, and optionally further receive frequencies. The receive frequencies may be freely programmed. When a receive frequency is selected, a reception is carried out for the related time interval at this receive frequency. If no preamble of a frame is detected during this time interval, a different receive frequency is used and then a switch back takes place if no preamble was detected at that receive frequency. If a preamble is detected during a time interval, reception is continued so as to receive the frame. If the transmitter expects an acknowledgement (ACK), the acknowledgement is transmitted at the same frequency. In particular embodiments, two or more wireless networks conforming to IEEE 802.15.4 may be monitored using a single transceiver, so as to communicate on the different channels of the wireless networks.

Particular embodiments provide a method for operating a transceiver for wireless networks.

In particular embodiments, a first configuration register for setting a first receive frequency of a first channel and a second configuration register for setting a second receive frequency of a second channel are programmed. In particular, the first channel is assigned to a first wireless network and the second channel is assigned to a second wireless network. For programming purposes, for example, a first register value corresponding to the first receive frequency is written to the first configuration register, and a second register value corresponding to the second receive frequency is written to the second configuration register, via a programming interface.

A controlled oscillator is actuated by a digital control word for operating an output frequency in one of several frequency ranges. In particular embodiments, the output frequency of the controlled oscillator is adjusted by a phase-locked loop to the set first receive frequency or second receive frequency. In particular embodiments, the controlled oscillator may be a voltage-controlled oscillator (VCO) and part of the loop.

In particular embodiments, a first value of the digital control word is automatically determined by an oscillator control unit. The determined first value of the digital control word is output to the controlled oscillator. The first value of the digital control word is assigned to the first receive frequency. In particular embodiments, the automatically determined first value of the digital word is stored in a first control register.

In particular embodiments, a second value of the digital control word is automatically determined by the oscillator control unit. The determined second value of the digital control word is output to the controlled oscillator. The second value of the digital control word is assigned to the second receive frequency. In particular embodiments, the automatically determined second value of the digital word is stored in a second control register.

In particular embodiments, the first value of the digital control word that is stored in the first control register is read and output as the initial value to the controlled oscillator to set the first receive frequency of the first channel.

To set the second receive frequency of the second channel, the second value of the digital control word that is stored in the second control register is read and output as the initial value to the controlled oscillator.

Particular embodiments are explained in connection with the figures. Particular embodiments reduce the switching times that arise when switching between two receive frequencies. During the switching times, a preamble cannot be detected. A signal of a preamble that is transmitted during the switching time cannot be detected by the transceiver. If the first time interval and the second time interval and the switching time between the time intervals are shorter than a length of the preamble, a preamble may be reliably detected even if first reception takes place on the "wrong" channel, and the "correct" channel is not selected until the receive frequency is switched.

Particular embodiments relate to both the transceiver and to the method for operating a transceiver.

In particular embodiments, the first channel may be assigned to a first wireless network and the second channel may be assigned to a second wireless network. In particular embodiments, the transceiver may optionally communicate with the nodes of the first wireless network or the nodes of the second wireless networks. In particular embodiments, the transceiver may perform the function of what is referred to as a gateway between the first wireless network and the second wireless network.

In particular embodiments, the first channel is assigned to a first protocol, and the second channel is assigned to a second protocol, which is different from the first protocol. Both protocols may be used in exactly one wireless network. A protocol, which is also referred to as a network protocol or communications protocol, is an exact set of rules according to which information is exchanged between nodes of the wireless network. The rules describe a syntax, which determines the communication by means of communicating entities in units of the nodes. For example, when using the International Organization for Standardization-Open Systems Interconnection (ISO-OSI) reference model, the individual protocols are organized in layers.

In particular embodiments, the first protocol and the second protocol differ from one another by different functions in at least one layer, notably in layers that are higher compared to the media access control (MAC) layer, such as the network layer, transport layer, session layer, presentation layer, or application layer. The layers, for example both applications layers, may operate with different protocols independently of each other. The MAC layer may also be referred to as the media access control layer in the expanded OSI model. In particular embodiments, for example, the first protocol is assigned to a data transmission rate that is higher compared to the second protocol. In particular embodiments, the first protocol differs from the second protocol with respect to the data security.

In particular embodiments, the same transceiver is equipped to receive both frames of the first protocol and of the second protocol.

In particular embodiments, the oscillator device is equipped to output an oscillator signal of the first receive frequency or the second receive frequency.

In particular embodiments, the oscillator device comprises a phase-locked loop having a controlled oscillator. The controlled oscillator may be a voltage-controlled oscillator VCO.

In particular embodiments, the phase-locked loop may be equipped to adjust an output frequency of the controlled oscillator to the set first receive frequency or second receive frequency.

In particular embodiments, the controlled oscillator may be equipped to operate the output frequency in several frequency ranges. Each of the frequency ranges may be actuated by a digital control word.

Particular embodiments provide an oscillator control unit for the actuation by the digital control word, which is connected to the phase-locked loop.

The oscillator control unit is equipped to automatically determine a first value of the digital control word assigned to the first receive frequency and to output the first value to the controlled oscillator.

In particular embodiments, the transceiver comprises a first control register and a second control register. The control registers may be combined with the oscillator control unit in the circuitry layout or they may be combined with other registers in a register unit.

In particular embodiments, the oscillator control unit may be equipped to store the automatically determined first value of the digital control word in the first control register.

The oscillator control unit is likewise equipped to automatically determine a second value of the digital control word assigned to the second receive frequency and to output the second value to the controlled oscillator. In particular embodiments, the oscillator control unit may be equipped to store the automatically determined second value of the digital control word in the second control register.

In particular embodiments, the oscillator control unit may be equipped to read the first value of the digital control word that is stored in the first control register and to output it as the initial value to the controlled oscillator to set the first receive frequency of the first channel. In particular embodiments, the oscillator control unit is additionally equipped to read the second value of the digital control word that is stored in the second control register and to output it as the initial value to the controlled oscillator to set the second receive frequency of the second channel.

In particular embodiments, the oscillator control unit may be equipped to automatically determine the first value of the digital control word and to store it in the first control register prior to a receive mode for receiving the frame and to immediately thereafter automatically determine the second value of the digital control word and store it in the second control register.

In particular embodiments, the transceiver comprises a determination unit, which is equipped to determine a first measured value of a received signal in the first channel during the first time interval and in the second channel during the second time interval. The measured value of the received signal is suited as an indicator of a detectable received signal, whether the received signal contains components that are very likely to be detected. The first measured value is, for example, a field strength measured value (ED), a value derived from the received field strength (RSSI), or an aggregate signal of a correlation device. The first measured value is not determined simultaneously in the first channel and in the second channel, but rather successively.

In particular embodiments, the control unit may be equipped to compare the first measured value to a first threshold. For example, the control unit comprises a digital comparator for the comparison, which compares the first measured value to a fixed or programmable threshold value as the first threshold.

In particular embodiments, the control unit may be equipped to control a first extension of the first time interval for detection if the first measured value exceeds the first threshold within the first time interval. In particular embodiments, the control unit is also equipped to control a second extension of the second time interval for detection if the first measured value exceeds the first threshold within the second time interval.

In particular embodiments, the determination unit is equipped to determine a second measured value by cross-correlating digital sampled values generated from the received signal with a sequence of the preamble predefined on the receiver side. In particular embodiments, the control unit may be equipped to compare the second measured value to a second threshold.

In particular embodiments, the control unit is equipped to control the reception of the frame in the first channel if the second measured value exceeds the second threshold within the first time interval or the first extension. In particular embodiments, the number of times that the second measured value exceeds the second threshold are counted by means of a counter of the control unit and a count value of the counter is compared to a count threshold.

The control unit may be additionally equipped to control the reception of the frame in the second channel if the second measured value exceeds the second threshold within the second time interval or the second extension.

In particular embodiments, the determination unit comprises a correlation device for determining the first measured value, the second measured value, a third measured value, and optionally a fourth measured value.

The correlation device comprises a delay unit. The delay comprises notably memory cells, which may form a shift register.

The correlation device comprises a first linking unit, which is connected to outputs of the first delay unit. The first linking unit is equipped to link a first part of a link sequence to first memory values stored in the first delay unit.

The correlation device comprises a first addition unit, which is connected to outputs of the first linking unit and designed to output a first aggregate signal.

The correlation device comprises a second linking unit, which is likewise connected to outputs of the first delay unit. The second linking unit is equipped to link a second part of the link sequence to first memory values stored in the first delay unit. The first linking unit and the second linking unit are interconnected to the first delay unit for parallel linking, wherein the values stored in the first delay unit may be linked to the first part and to the second part of the link sequence at the same time.

The correlation device comprises a second addition unit, which is connected to outputs of the second linking unit and designed to output a second aggregate signal. The first aggregate signal and the second aggregate signal are output simultaneously at the same values in the first delay unit.

The control unit is connected to the first addition unit and to the second addition unit and is equipped to evaluate the second aggregate signal as the first measured value and the first aggregate signal as a further (alternative first or third) measured value.

In particular embodiments, the control unit comprises a first comparator for comparing the second aggregate signal to a first threshold and a second comparator for comparing the first aggregate signal to the second/third threshold.

Particular embodiments may be individual embodiments or in combination with other embodiments. Several particular example embodiments are explained in the description of the Figures, but for simplicity, all possible combinations are not shown.

Figure 7:
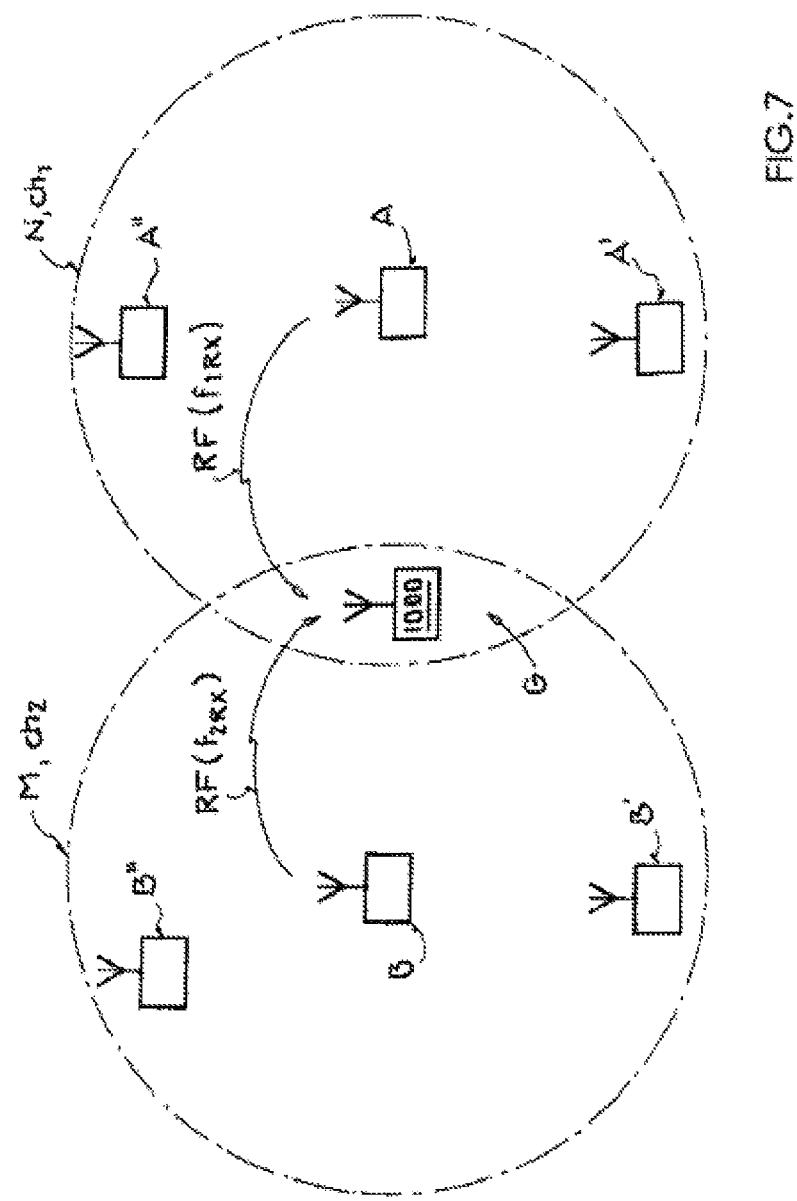
FIG. 7 shows an example schematic illustration of two wireless networks.

FIG. 7 shows an example of a wireless personal area network (WPAN) data transmission system according to the IEEE 802.15.4-2006 industry standard. The WPAN data transmission system comprises a first wireless network N having the nodes A, A', A", and G, and the second wireless network M having the nodes B, B', B", and G. The node G may be assigned to both the first wireless network N and to the second wireless network M and may form, for example, what is referred to as a gateway (network transition) between the first wireless network N and the second wireless network M.

The nodes A, A', A", G, B, B', B" may be stationary or mobile devices, which exchange information wirelessly by way of radio signals. Node A may be what is referred to as a full-function device, which assumes the function of the WPAN coordinator, while the nodes A', A" may be what is referred to as partial-function devices, which are assigned to the full function device (node A) and may exchange data only with this device. Node G also may have the function of a full-function device in the first wireless network N and in the second wireless network M at the same time. Nodes B, B', and B", in contrast, may be partial-function devices.

For each wireless network, a node designed as a full function device assumes the special function of the personal area network (PAN) coordinator. The PAN coordinator establishes the PAN identifier PAN.ID, which delimits the wireless network from other IEEE 802.15.4 wireless networks in the wireless range. In particular embodiments, the PAN coordinator may take over the synchronization of all network nodes in what is referred to as the slotted mode. In order to separate the wireless networks, each wireless network N, M may be assigned a predefined channel. In the example embodiment of FIG. 7, the nodes A, A', A" in the first wireless network N communicate in a first channel ch1, while the nodes B, B', B" in the second wireless network M communicate in a second channel ch2. The communication in the first channel ch1 and in the second channel ch2 may take place simultaneously. The communication of nodes A, A', A" in the first wireless network N does not interfere with the nodes B, B', B" in the second wireless network M.

In particular embodiments, node G comprises a transceiver 1000 having a tunable oscillator during ongoing operation. This enables the transceiver 1000 of node G to receive both radio signals of a first receive frequency $f_{1RX}$ of the first channel ch1 in the first wireless network N and radio signals of a second receive frequency $f_{2RX}$ of the second channel ch2 in the second wireless network M. In particular embodiments, the transceiver 1000 of node G may transmit accordingly in the first channel ch1 and in the second channel ch2 so as to enable bidirectional communication with the nodes A, A', A", B, B', B".

The example embodiment in FIG. 7 is provided purely by way of example, and node G may also function only in the first wireless network N as a PAN coordinator, it may function in both networks N, M as a PAN coordinator, or it may function in both networks N, M as a simple full-function device. Particular embodiments provide a plurality of full-function devices, or exclusively full-function devices, in each wireless network N, M (peer-to-peer topology). For the node G to function as a gateway, node G is within both the transmission range of a node A, A', A" of the first wireless network N and within the transmission range of another node B, B', B" of the second wireless network M.

In particular embodiments, node G further comprises a power supply unit, which is not shown in FIG. 7, for example in the form of a battery, and optionally further components, such as sensors, actuators, and the like. In particular embodiments, node A transmits, for example, a frame F conforming with the IEEE 802.15.4 industry standard to node G. A simplified example embodiment of such a frame F is shown schematically in FIG. 3. Frame F comprises a preamble P having a preamble sequence <010110> known on the receiver side and data symbols DSym1, DSym2. On the receiver side, L sampled values (coefficients) may be provided for each symbol DSym1, DSym2.

Figure 8:
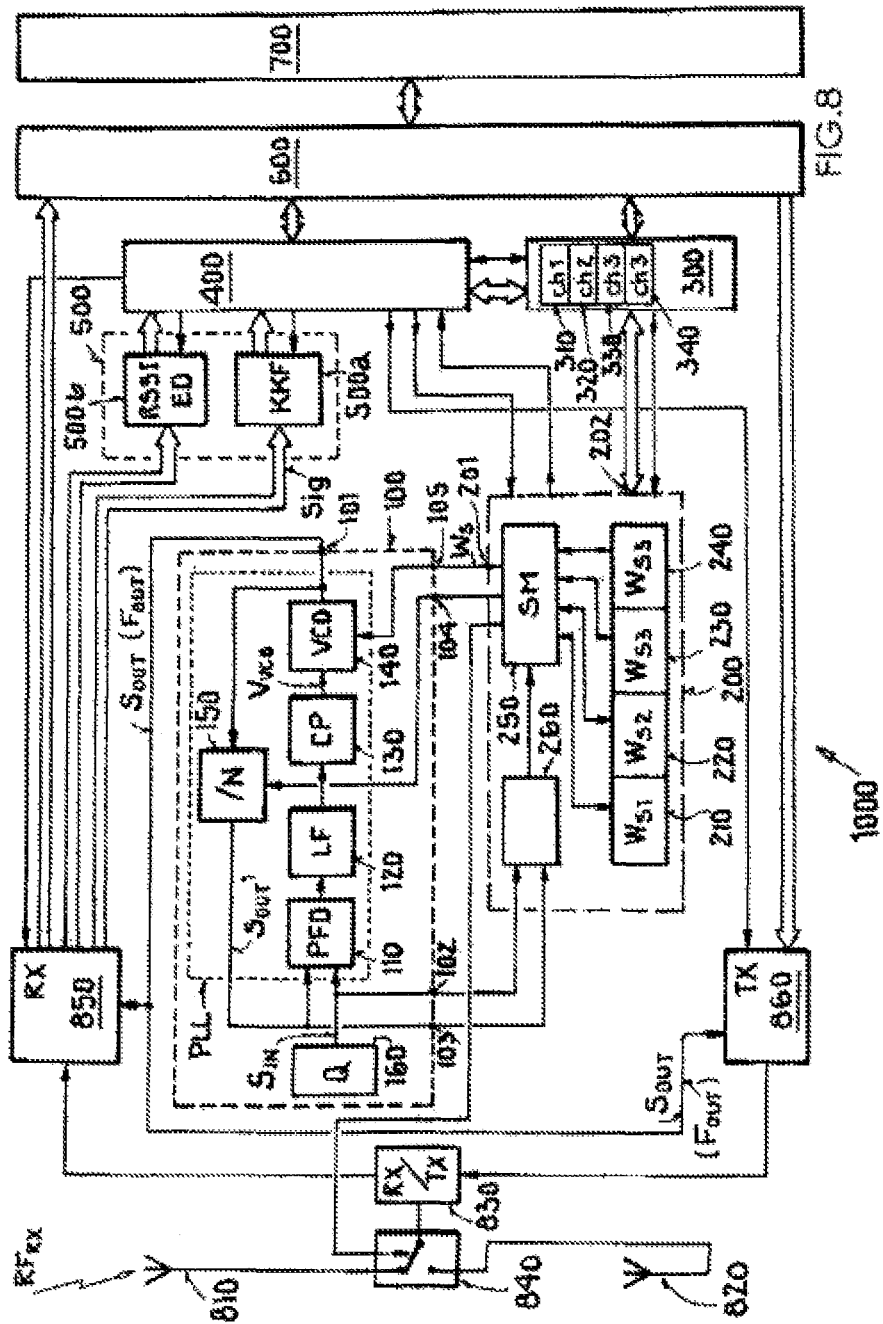
FIG. 8 shows an example block diagram of a transceiver.

A particular example embodiment of a transceiver 1000 is shown in FIG. 8. A radio signal $RF_{RX}$ is received via an antenna 810. In particular embodiments, for example, the transceiver 1000 comprises a tunable oscillator device 100 having a phase-locked loop PLL and a reference oscillator 160 in the form of an oscillating crystal.

In particular embodiments, the phase-locked loop PLL is equipped to adjust an output frequency $F_{OUT}$ of the controlled oscillator 140 to the set first receive frequency $f_{1RX}$ or second receive frequency $f_{2RX}$. The phase-locked loop PLL comprises a voltage-controlled oscillator (VCO) 140, the output signal $S_{OUT}$ that is output at the output 101 of the oscillator device 100 to a receiver unit 850 and to a transmitter unit 860. The phase-locked loop PLL further comprises an adjustable frequency divider 150, a PDF 10, a loop filter 120, and a charge pump 130, which are interconnected among each other in the known manner.

In particular embodiments, by means of the transmit-receive switch unit 830, the receiver unit 850 shown in FIG. 8 may be used to receive frames F and to detect preambles P of frames F in several channels ch1, ch2, ch3. In particular embodiments, each channel ch1, ch2, ch3 may be assigned to a wireless network M, N. The channels ch1, ch2, ch3 used during operation must be previously stored. In the example embodiment of FIG. 8, the transceiver 1000 comprises a first configuration register 310, a second configuration register 320, a third configuration register 330, and a fourth configuration register 340 in a register block 300. The configuration registers 310, 320, 330, 340 may be programmed via an interface 600, for example by means of a processor 700. In particular embodiments, a register value for the first channel ch1 is programmed in the first configuration register 310, a register value for the second channel ch2 is programmed in the second configuration register 320, and a register value is also programmed for the third channel ch3 in the third configuration register 330 and in the fourth configuration register 340. In this way, the transceiver 1000 may switch the reception and transmission between the channels ch1, ch2, ch3 during ongoing operation.

In particular embodiments, the transceiver 1000 comprises a control unit 400. The control unit 400 has a digital logic, for example in the form of a state machine. The control unit 400 is equipped to control the current channel for receiving or transmitting a signal. To this end, the control unit 400 is connected to the receiver unit 850, a transmitter unit 860, and to the interface 600. If the processor 700, via the interface 600, for example, requests the transmission of data, the control unit 400 deactivates the receiver unit 850 and activates the transmitter unit 850. By selecting the configuration register 310, 320, 330, 340, the output frequency $F_{OUT}$ of the oscillator device 100 is adjusted to the corresponding transmission frequency based on the value stored in the configuration register 310, 320, 330, 340. In particular embodiments, for example, the output frequency $F_{OUT}$ of the oscillator device 100 is adjusted to the transmission frequency of the first channel ch1 based on the first configuration register 310.

In a receive mode, the control unit 400 is additionally equipped for temporal control. Because the transceiver 1000 comprises only exactly one receiver unit 850, availability of the receiver unit 850 for reception must divided temporally among the channels ch1, ch2, ch3 preset in the configuration registers 310, 320, 330, 340. It is not foreseeable at what time in what channel ch1, ch2, ch3 a received radio frequency signal $RF_{RX}$ is present. Accordingly, the channels ch1, ch2, ch3 input in the configuration registers 310, 320, 330, 340 must be repeatedly scanned in rapid succession for a preamble P in the received signal $RF_{RX}$.

In particular embodiments, the control unit 400 is equipped to control the oscillator device 100 in a first time interval Δt1 with the first receive frequency $f_{1RX}$ of the first channel ch1 by reading the first configuration register 310. In this way, a detection of a preamble P is carried out in the first channel ch1 during the first time interval Δt1. The control unit 400 is equipped to control the oscillator device 100 in a second time interval Δt2 with the second receive frequency $f_{2RX}$ of the second channel ch2 by reading the second configuration register 320. In this way, a detection of a preamble P is carried out in the second channel ch2 during the first time interval Δt2. The second time interval Δt2 follows, for example, the first time interval Δt1 or an extension E1 of the first time interval Δt1, as is shown by way of example in FIG. 9.

Figure 10:
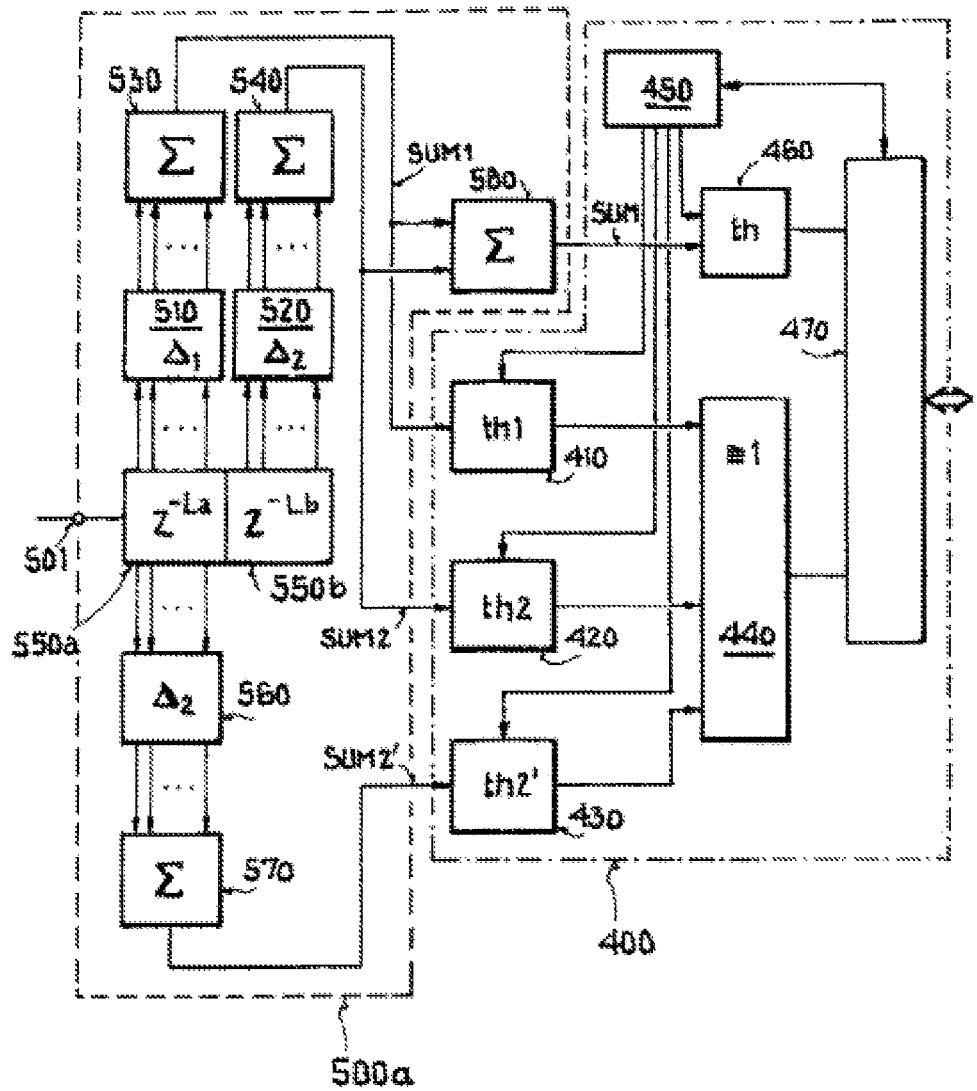
FIG. 10 shows a first example embodiment of a correlation device.
Figures 11A, 11B:
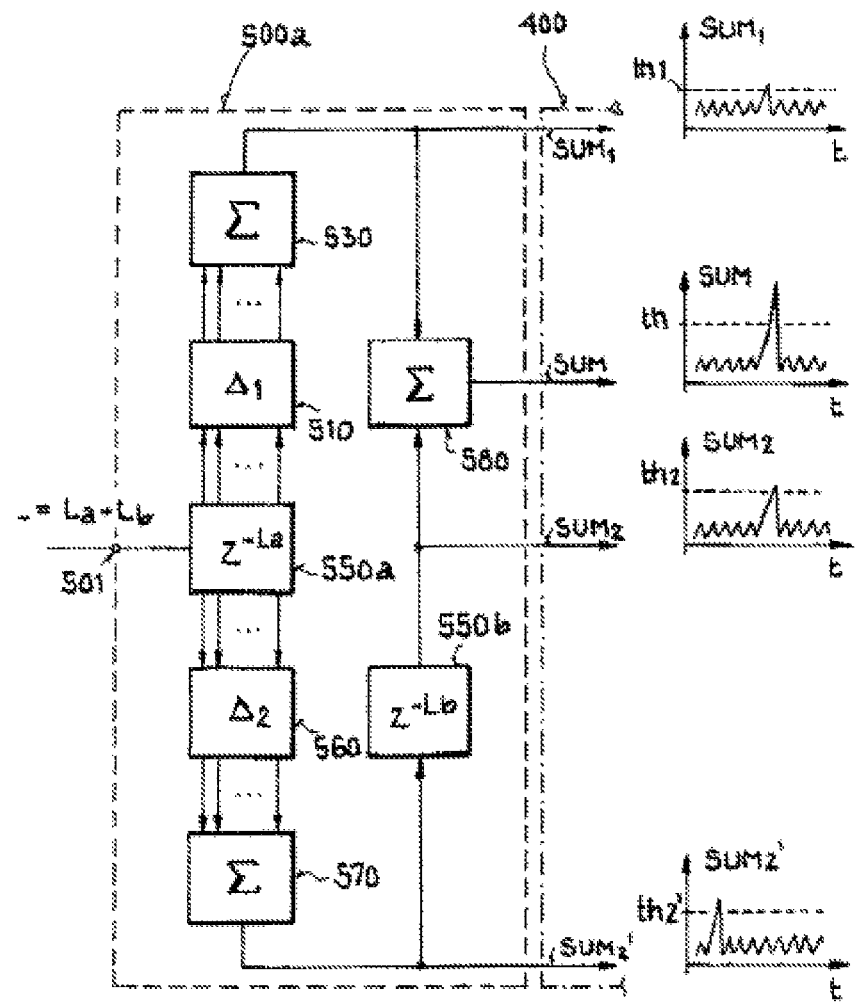
FIG. 11a shows a second example embodiment of a correlation device.
FIG. 11b shows an example schematic view of output signals of the correlation device of the second example embodiment.

In particular embodiments, the transceiver 1000 comprises a determination unit 500, which is equipped to determine a first measured value of the received signal $RF_{RX}$. In the example embodiment of FIG. 8, the determination unit 500 comprises two parts 500a, 500b, wherein the first part 500a uses a cross-correlation filter function KKF to generate the first measured value from a digital signal sequence Sig generated from the received signal. Particular example correlation devices for determining the first measured value SUM1, SUM2, SUM2' are shown in FIGS. 10 and 11a. In the second part 500b of the determination unit 500 according to the example embodiment of FIG. 8, the first measured value ED, RSSI is obtained from a signal field strength of the received signal $RF_{RX}$. In particular embodiments, for example, the first measured value ED may be determined from a single field strength measurement or the first measured value RSSI may determined from mean values of the field strength, such as an received signal strength indication (RSSI) value.

The first measured value RSSI, ED, SUM1, SUM2, SUM2' is a quantity that indicates the likelihood of whether a preamble P of a frame F to be detected is contained in the received signal $RF_{RX}$. For example, if the energy in the channel rises, the likelihood that a preamble P is presently being sent increases. In particular embodiments, the first measured value RSSI, ED, SUM1, SUM2, SUM2' of the received signal $RF_S$ is determined in the first time interval Δt1 in the first channel ch1 and in the second time interval Δt2 in the second channel. The determination therefore does not take place simultaneously in both channels ch1, ch2.

In particular embodiments, the control unit 400 comprises a digital comparator 410, 420, 430 for comparing the first measured value RSSI, ED, SUM1, SUM2, SUM2' to a first threshold th1, th2, th2'. A digital comparator 410, 420, 430 is shown in FIG. 10, for example, for the measured values SUM1, SUM2, SUM2'.

The transceiver 1000 of FIG. 8 additionally comprises an oscillator control unit 200, which is connected to the configuration registers 310, 320, 330, 340, the control unit 400, and the oscillator device 100. The oscillator control unit 200 of FIG. 8 comprises a first control register 210, a second register 220, a third control register 230, and a fourth control register 240. In particular embodiments, the oscillator control unit 200 comprises a determination unit 260 and a logic 250, for example, in the form of a state machine SM. The divider ratio of the frequency divider 150 may be controlled via the input 104 of the oscillator device 100. The oscillator control unit 200 is equipped to output a digital control word $W_S$ at the output 201, the control word being present at the input 105 of the oscillator device 100 and setting a frequency range C1, . . . , C8 of the controlled oscillator 140. In particular embodiments, the determination unit 260 may comprise the self-calibrating circuit 60 according to FIG. 2, however it may also be different so as to form the control word from the fed-back signal $S_{OUT}$' and from the output signal $S_{IN}$ of the reference oscillator 160 that are output at the outputs 102 and 103.

Figure 6:
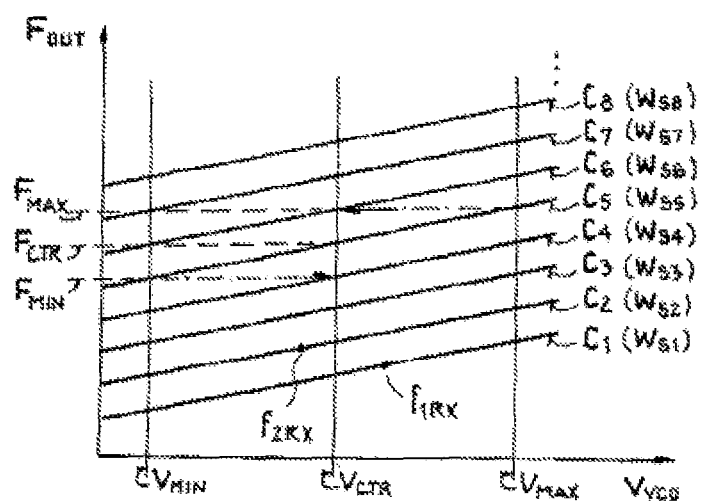
FIG. 6 shows an example schematic illustration of work curves of a voltage-controlled oscillator.

In particular embodiments, the controlled oscillator 140 is equipped to operate the output frequency $F_{OUT}$ in several frequency ranges C1 . . . C8. In particular embodiments, each of the frequency ranges C1 . . . C8 may be actuated by the digital control word $W_S$. FIG. 6 is a schematic illustration of eight out of, for example, sixteen frequency ranges C1, . . . , C8. Each frequency range C1, C2, C3, C4, C5, C6, C7, C8 is assigned a value $W_{S1}$, $W_{S2}$, $W_{S3}$, $W_{S4}$, $W_{S5}$, $W_{S6}$, $W_{S7}$, $W_{S8}$ of the control word $W_S$. Each frequency range C1, . . . , C8 may be defined by a load line of the input voltage $V_{VCO}$ of the controlled oscillator 140 between the voltages $V_{MIN}$ and $V_{MAX}$ around the center voltage $V_{CTR}$. The range boundaries $F_{MIN}$ and $F_{MAX}$ around the center frequency $F_{CTR}$ are shown by way of example for the fifth frequency range C5. In the example embodiment of FIG. 6, the frequency ranges C1, . . . , C8 may overlap.

In the example embodiment of FIG. 8, the oscillator control unit 200 is equipped to automatically determine a first value $W_{S1}$ of the digital control word $W_S$ assigned to the first receive frequency $f_{1RX}$ and to output the first value $W_{S1}$ to the controlled oscillator 140. Instantaneous values for the control voltage $V_{VCO}$ and output frequency $F_{OUT}$ for the receive frequency $f_{1RX}$ are shown by way of example in FIG. 6.

The oscillator control unit 200 is equipped to store the automatically determined first value $W_{S1}$ of the digital control word $W_S$ in the first control register 210. In particular embodiments, the frequency range may change as a result of the automatic determination due to temperature changes or other drift effects. In this case, the existing value of the digital control word $W_S$ in the first control register 210 may be overwritten with the current value by the oscillator control unit 200.

The oscillator control unit 200 of FIG. 8 is equipped to automatically determine a second value $W_{S2}$ of the digital control word $W_S$ assigned to the second receive frequency $f_{2RX}$ and to output the second value $W_{S2}$ to the controlled oscillator 140 via the input 105. The automatically determined second value $W_{S2}$ of the digital word $W_S$ is also stored in the assigned second control register 220.

Figure 9:
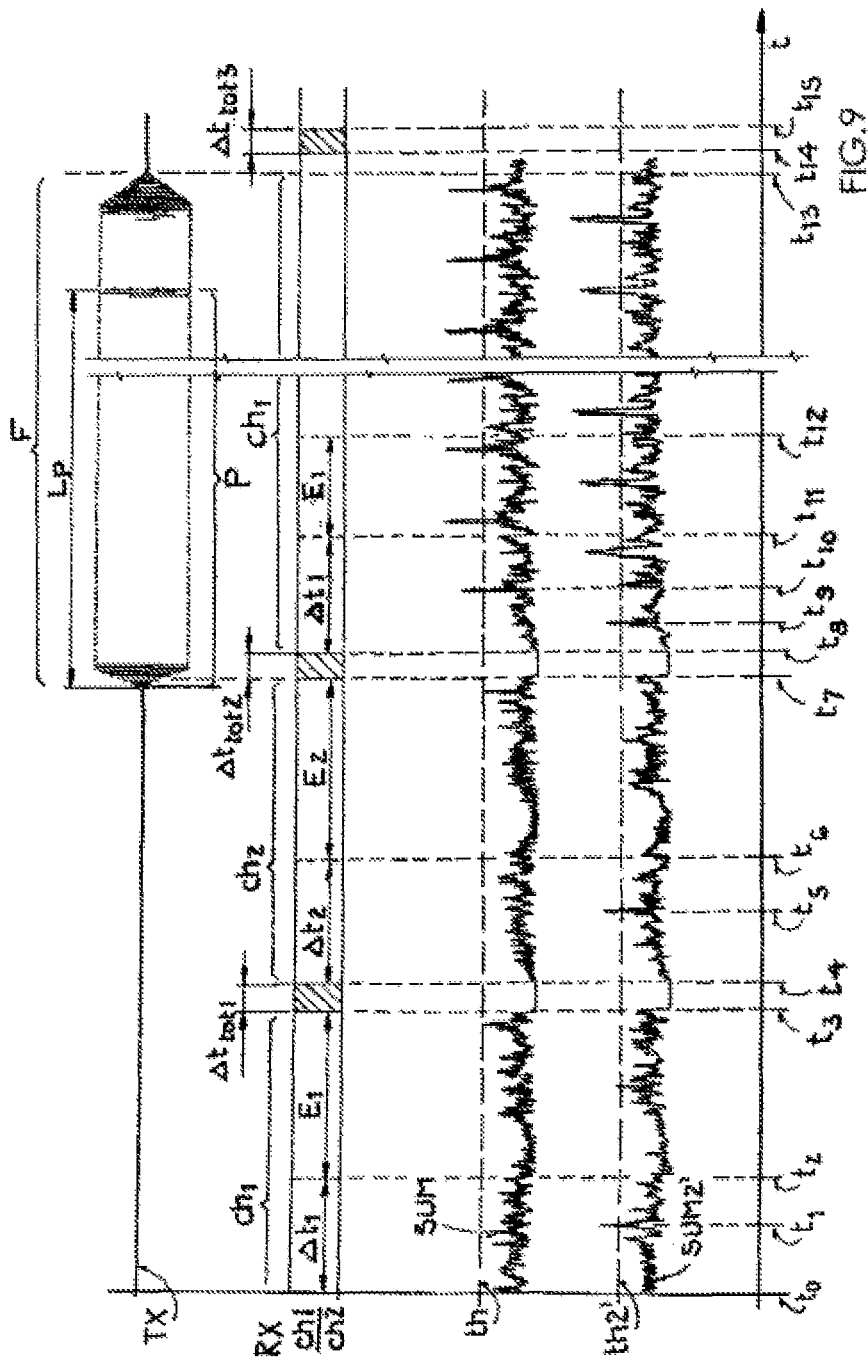
FIG. 9 shows an example schematic diagram containing measured values.

The example embodiment in FIG. 9 shows a dead time range $\Delta t_{tot1}$ between the extension E1 of the first time interval Δt1 and the second time interval Δt2. Also shown are further dead time ranges $\Delta t_{tot2}$, $\Delta t_{tot3}$, which occur each time a switch takes place between two receive frequencies $f_{1RX}$ in the first channel ch1 and $f_{2RX}$ in the second channel ch2. The dead time ranges $\Delta t_{tot1}$, $\Delta t_{tot2}$, $\Delta t_{tot3}$ are dependent on the duration that it takes the oscillator control device 200 and the oscillator device 100 to adjust the required frequency range C1, . . . , C8. No detection of a preamble P is possible during the dead time ranges $\Delta t_{tot1}$, $\Delta_{tot2}$, $\Delta t_{tot3}$. Accordingly, the shortest possible dead time range $\Delta t_{tot1}$, $\Delta t_{tot2}$, $\Delta t_{tot3}$ is desired for the maximum possible sensitivity of the transceiver 1000.

In the example embodiment of FIG. 8, the oscillator control unit 200 is equipped to read the first value $W_{S1}$ of the digital control word $W_S$ that is stored in the first control register 210 and to output it as the initial value to the controlled oscillator 140 to set the first receive frequency $f_{1RX}$ of the first channel ch1. In particular embodiments, the second value $W_{S2}$ of the digital control word $W_S$ is read and output as the initial value to the controlled oscillator 140 for the second receive frequency $f_{2RX}$. In particular embodiments, the third value $W_{S3}$ of the digital control word $W_S$ is read and output as the initial value to the controlled oscillator 140 for the third receive frequency.

In the example embodiment of FIG. 8, a first switch value is assigned to the first configuration register 310 and to the third configuration register 330, and a second switch value is assigned to the second configuration register 320 and to the fourth configuration register 340, for switching between the first antenna 810 and a second antenna 820 by means of a switch unit 840. If, as in the embodiment of FIG. 8, the same register value for the third channel ch3 is written to the third and fourth configuration registers 330, 340, switching may take place between the first antenna 810 and the second antenna 820 for the same receive frequency/transmit frequency so as to reduce interference effects during the wireless transmission (antenna diversity).

FIG. 9 shows an example embodiment comprising a first measured value SUM2' and a second measured value SUM over the time t in a schematic illustration. The first measured value SUM2', for example, is the second aggregate signal SUM2' of FIG. 10. In particular embodiments, the first aggregate signal SUM1 or the third aggregate signal SUM2 may be used as the first measured value. The second measured value SUM is, for example, the fourth aggregate signal SUM from the summing unit 580 according to FIG. 10.

In the upper region of FIG. 9, the transmission TX of a frame F having a preamble P of the length $L_P$ is shown schematically from before the time t7 until the time t13.

The lower region of FIG. 9 is a schematic illustration of the receive mode RX of the receiving node in channels ch1 and ch2 with the dead time ranges $\Delta t_{tot1}$, $\Delta t_{tot2}$, $\Delta t_{tot3}$ located in between.

In particular embodiments, the control unit 400 of FIG. 8 is equipped to control a first extension E1 of the first time interval $\Delta t1$ for detection of the preamble if the first measured value SUM2' exceeds the first threshold th2' within the first time interval $\Delta t1$. According to FIG. 9, the measured value SUM2' exceeds the first threshold th2' at the time t1 during the first time interval $\Delta t1$ between the times t0 and t2, so that the detection is not limited by the times t0 and t2, but is extended by the first extension E1 up to the time t3. In particular embodiments, a switch to the second channel ch2 takes place between the times t3 and t4.

In particular embodiments, the control unit 400 of FIG. 8 is equipped to control a second extension E2 of the second time interval $\Delta t2$ for detection of the preamble if the first measured value SUM2' exceeds the first threshold th2' within the first second time interval $\Delta t2$. According to FIG. 9, the measured value SUM2' exceeds the first threshold th2' at the time t5 during the second time interval $\Delta t2$ between the times t4 and t6, so that the detection is extended by the second extension E2 up to the time t7.

The first time interval $\Delta t1$, the second time interval $\Delta t2$, the first extension E1, and the second extension E2 may be predefined, such as fixed, or may be programmed in the control device 400.

In particular embodiments, another switch to the first channel ch1 takes place between the times t7 and t8 because the second measured value SUM does not exceed the second threshold th, no preamble P was detected.

Just before the time t7, the preamble P is transmitted in the first channel ch1, so that at the time t9 the first measured value SUM2' exceeds the first threshold th2', whereby an extension E1 up to t12 takes place. At the time t10, the second measured value SUM exceeds the second threshold th. The control device 400 of FIG. 8 is equipped to control the reception of the frame F in the first channel ch1 if the second measured value SUM exceeds the second threshold th within the first time interval $\Delta t1$ or the first extension E2. This example embodiment is shown in FIG. 9. The transmission of the frame F ends at the time t13, so that the reception in the first channel ch1 is ended at the time t14. The channels are only switched again between times t14 and t15.

As is shown in FIG. 9, a sum of the first time interval $\Delta t1$ and the second time interval $\Delta t2$ is smaller than a length $L_P$ of the preamble P, so that it is very likely that during transmission of the preamble P in the first channel ch1 the receiving transceiver 1000 switches to the first channel ch1.

FIG. 10 is a schematic illustration of an example embodiment. FIG. 10 shows a correlation device 500a. The correlation device 500a comprises a first delay unit 550a, which has an input 501 for an input signal sequence/sampled values and outputs for values stored in the first delay unit 550a. The delay unit 550a may be a memory unit, for example a shift register.

In particular embodiments, the correlation device 500a comprises a first linking unit 510, which is connected to the outputs of the first delay unit 550a. The first linking unit 510 is equipped to link (scaling, inversion, addition, multiplication) a first part of a link sequence to first values stored in the first delay unit 550a. In particular embodiments, linking may be carried out, for example, by scaling, inversion, addition, or multiplication. The correlation device 500a comprises a first addition unit 530, which is connected to the outputs of the first linking unit 510 and designed to output a first aggregate signal SUM1.

In particular embodiments, the correlation device 500a comprises a second linking unit 560, which is connected to the outputs of the first delay unit 550a. The second linking unit 560 is equipped to link a second part of a link sequence to first values stored in the first delay unit 550a. The correlation device 500a comprises a second addition unit 570, which is connected to the outputs of the second linking unit 560 and designed to output a second aggregate signal SUM2'.

A particular embodiment of the control unit 400 is provided, which is connected to the first addition unit 530, to the second addition unit 570, which is equipped to evaluate the first aggregate signal SUM1 and the second aggregate signal SUM2' as the first measured value SUM2'.

FIGS. 10 and 11a additionally show further example embodiments of the correlation device 550a, which may be combined with those mentioned above.

In particular embodiments, the control unit 400 comprises a first comparator 430 for comparing the second aggregate signal SUM2' to a first threshold th2'. In particular embodiments, the control unit 400 comprises a third comparator 410 for comparing the first aggregate signal SUM1 to a third threshold th1.

In particular embodiments, the control device 400 in FIG. 10 comprises a fourth comparator 420 for comparing a third measured value SUM2 to a fourth threshold th2. The output signals of the first comparator 430 and of the third comparator 410 and of the fourth comparator 420 may be evaluated by the downstream logic 440. The logic 440 has, for example, logical disjunctions of the output signals of the comparators 410, 420, 430. Particular embodiments provide a second comparator 460 that compares a fourth aggregate signal SUM to a second threshold th. The fourth aggregate signal SUM forms, for example, the second measured signal SUM. A state machine 470, which controls the temporal flow of a process, is connected to the outputs of the second comparator 460 and the logic 440. The values of the thresholds th, th1, th2, th2' may be stored in the threshold register 450 or specified as fixed values. The threshold register 450 is connected to the state machine 470 or to an interface for programming the thresholds th, th1, th2, th2'.

In particular embodiments, the correlation device 500a of FIG. 10 comprises a second delay unit 550b, which is connected to an output of the first delay unit 550a, so that the sampled values are applied by the first delay unit 500a with delay to the second delay unit 550b. The second delay unit 550b comprises outputs for values stored in the second delay unit 550b. The second delay unit 550b comprises a memory unit, for example a shift register.

In particular embodiments, the correlation device 500a comprises a third linking unit 520, which is connected to the outputs of the second delay unit 550b. The third linking unit 520 is equipped to link a second part of a link sequence to second values stored in the second delay unit 550b. In particular embodiments, linking may be carried out by scaling, inversion, addition, or multiplication. The correlation device 500a comprises a third addition unit 540, which is connected to the outputs of the third linking unit 520 and designed to output the third aggregate signal SUM2. The fourth aggregate signal SUM is calculated by adding the first aggregate signal SUM1 and the third aggregate signal SUM2 by means of addition carried out by a fourth addition unit 580.

In particular embodiments, the first delay unit 550a may have the same length as the second delay unit 550b of, for example, La=Lb=L/2 sampled values. The sampled values first reach the first delay unit 550a and then, delayed by the same, the second delay unit 550b. Particular embodiments determine whether the reception of a preamble signal is likely after only half of the sampled values L because of the parallel linking to the first part of the linking sequence and to the second part of the linking sequence by the first linking unit 510 and the second linking unit 560. In this way, the sampled values corresponding to the second part of the linking sequence do not have to be loaded into the second delay unit 550b, but rather may already be correlated in the first delay unit 550a by the second linking unit 560 and supply the first measured value SUM2'.

FIG. 11a shows a schematic illustration of another example embodiment of a correlation device 550a. Contrary to the example embodiment of FIG. 10, the second delay unit 550b is connected downstream of the second addition unit 570, so that the third aggregate signal SUM2 is generated by delaying the values of the second aggregate signal SUM2' by means of the second delay unit 550b.

FIG. 11b shows a schematic illustration of corresponding example aggregate signals SUM1, SUM, SUM2, SUM2'. It is apparent that the second aggregate signal SUM2' is generated first in terms of time. In particular embodiments, the second aggregate signal SUM2' may be the first measured value for the early detection of a preamble P in the received signal.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

The present disclosure encompasses all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. A method comprising, by a transceiver:
   setting a first receive frequency of a first channel of the transceiver and a second receive frequency of a second channel of the transceiver;
   during a first time interval, receiving a first radio frequency (RF) signal on the first channel;
   determining that a first measured value indicative of a first detectable received RF signal on the first channel exceeds a first predetermined threshold, and in response, receiving a first data frame on the first channel;
   extending the first time interval by a first extension of time in response to receiving the first data frame on the first channel;
   during a second time interval, receiving a second RF signal on the second channel;
   determining that a second measured value indicative of a second detectable received RF signal on the second channel exceeds the first predetermined threshold, and in response, receiving a second data frame on the second channel; and
   extending the second time interval by a second extension of time in response to receiving the second data frame on the second channel.

2. The method of claim 1, further comprising transmitting an acknowledgement message in response to receiving at least one of the first and second data frames.

3. The method of claim 1, further comprising:
   setting a third receive frequency of a third channel of the transceiver;
   during a third time interval, receiving a third RF signal on the third channel; and
   determining that a third measured value indicative of a third detectable received RF signal on the third channel exceeds the first predetermined threshold, and in response, receiving a third data frame on the third channel.

4. The method of claim 3, wherein each of the first channel, the second channel, and the third channel are associated with one of a first wireless network or a second wireless network.

5. The method of claim 1, wherein receiving the first RF signal on the first channel and receiving the second RF signal on the second channel occurs successively.

6. The method of claim 1, wherein the first and second measured values comprise at least one of a field strength measured value, a received signal strength indication value, a first aggregate signal, or a second aggregate signal.

7. The method of claim 1, wherein the first and second time intervals and the first and second extensions of time are predefined.

8. A device comprising:
   a transceiver comprising:
   a control unit configured to set a first receive frequency of a first channel of the transceiver and a second receive frequency of a second channel of the transceiver; and
   a receiver unit configured to:
   during a first time interval, receive a first radio frequency (RF) signal on the first channel;
   during a second time interval, receive a second RF signal on the second channel;

the control unit further configured to:
  determine that a first measured value indicative of a first detectable received RF signal on the first channel exceeds a first predetermined threshold, and in response, receive a first data frame on the first channel;
  extend the first time interval by a first extension of time in response to receiving the first data frame on the first channel;
  determine that a second measured value indicative of a second detectable received RF signal on the second channel exceeds the first predetermined threshold, and in response, receive a second data frame on the second channel; and
  extend the second time interval by a second extension of time in response to receiving the second data frame on the second channel.

9. The device of claim 8, the transceiver further configured to transmit an acknowledgement message in response to receiving at least one of the first and second data frames.

10. The device of claim 8, wherein the first channel is associated with a first wireless network and the second channel is associated with a second wireless network.

11. The device of claim 8, wherein receiving the first RF signal on the first channel and receiving the second RF signal on the second channel occurs successively.

12. The device of claim 8, wherein the first and second measured values comprise at least one of a field strength measured value, a received signal strength indication value, a first aggregate signal, or a second aggregate signal.

13. The device of claim 8, wherein the first and second time intervals and the first and second extensions of time are predefined.

14. A system comprising:
  an antenna configured to receive a radio frequency (RF) signal on a first channel of a transceiver and a second channel of the transceiver;
  the transceiver coupled to the antenna and configured to:
    set a first receive frequency of the first channel of the transceiver and a second receive frequency of the second channel of the transceiver;
    during a first time interval, receive a first radio frequency (RF) signal on the first channel;
    determine that a first measured value indicative of a first detectable received RF signal on the first channel exceeds a first predetermined threshold, and in response, receive a first data frame on the first channel;
    extend the first time interval by a first extension of time in response to receiving the first data frame on the first channel;
    during a second time interval, receive a second RF signal on the second channel;
    determine that a second measured value indicative of a second detectable received RF signal on the second channel exceeds the first predetermined threshold, and in response, receive a second data frame on the second channel;
    extend the second time interval by a second extension of time in response to receiving the second data frame on the second channel; and
  a processor coupled to the transceiver through a digital interface.

15. The system of claim 14, the transceiver further configured to transmit an acknowledgement message in response to receiving at least one of the first and second data frames.

16. The system of claim 14, wherein the first channel is associated with a first wireless network and the second channel is associated with a second wireless network.

17. The system of claim 14, wherein the first and second measured values comprise at least one of a field strength measured value, a received signal strength indication value, a first aggregate signal, or a second aggregate signal.

* * * * *

UNITED STATES PATENT AND TRADEMARK OFFICE
CERTIFICATE OF CORRECTION

PATENT NO.        : 9,054,718 B2
APPLICATION NO.   : 13/307561
DATED             : June 9, 2015
INVENTOR(S)       : Tilo Ferchland et al.

Page 1 of 1

It is certified that error appears in the above-identified patent and that said Letters Patent is hereby corrected as shown below:

In the specification

Col. 1, line 11, delete "and" and insert -- und --, therefor.

Col. 11, line 44, delete "$RF_S$" and insert -- $RF_{RX}$ --, therefor.

Signed and Sealed this
Twenty-seventh Day of October, 2015

Michelle K. Lee
*Director of the United States Patent and Trademark Office*